US011322662B2

(12) United States Patent
Brandl et al.

(10) Patent No.: US 11,322,662 B2
(45) Date of Patent: May 3, 2022

(54) OPTOELECTRONIC DEVICE, CONVERSION ELEMENT, METHOD OF PRODUCING A PLURALITY OF CONVERSION ELEMENTS AND METHOD OF PRODUCING AN OPTOELECTRONIC DEVICE

(71) Applicant: OSRAM Opto Semiconductors GmbH, Regensburg (DE)

(72) Inventors: Martin Brandl, Kelheim (DE); Alexander Baumgartner, Donaustauf (DE); Ion Stoll, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 31 days.

(21) Appl. No.: 16/398,889

(22) Filed: Apr. 30, 2019

(65) Prior Publication Data

US 2019/0341532 A1    Nov. 7, 2019

(30) Foreign Application Priority Data

May 2, 2018    (DE) .................. 10 2018 110 506.1

(51) Int. Cl.
*H01L 33/50*    (2010.01)
*H01L 33/56*    (2010.01)
*H01L 33/62*    (2010.01)
*H01L 33/54*    (2010.01)

(52) U.S. Cl.
CPC .......... *H01L 33/504* (2013.01); *H01L 33/505* (2013.01); *H01L 33/56* (2013.01); *H01L 33/62* (2013.01); *H01L 33/54* (2013.01); *H01L 2933/005* (2013.01); *H01L 2933/0041* (2013.01)

(58) Field of Classification Search
CPC ................... H01L 33/505; H01L 33/54; H01L 2933/0041; H01L 2933/005; H01L 33/504; H01L 33/56; H01L 33/62
See application file for complete search history.

(56) References Cited

U.S. PATENT DOCUMENTS

| 9,997,676 | B2 * | 6/2018 | Hung | .................... H01L 21/561 |
| 10,217,913 | B2 | 2/2019 | Pindl | |
| 2013/0207144 | A1 | 8/2013 | Ramchen | |
| 2016/0293810 | A1 * | 10/2016 | Baike | ...................... H01L 33/52 |
| 2016/0293812 | A1 * | 10/2016 | Pindl | .................. H01L 33/0095 |
| 2017/0033267 | A1 * | 2/2017 | Tamaki | ................. H01L 33/505 |
| 2017/0154880 | A1 * | 6/2017 | Ozeki | ..................... H01L 24/97 |

(Continued)

FOREIGN PATENT DOCUMENTS

| DE | 10 2010 026 343 A1 | 3/2012 |
| DE | 10 2013 112 549 A1 | 5/2015 |

(Continued)

*Primary Examiner* — Michael M Trinh
(74) *Attorney, Agent, or Firm* — DLA Piper LLP (US)

(57) ABSTRACT

The optoelectronic device including a radiation emitting semiconductor chip emitting electromagnetic radiation of a first wavelength range from a radiation exit surface, and a conversion element converting electromagnetic radiation of the first wavelength range into electromagnetic radiation of a second wavelength range at least partially and emitting electromagnetic radiation from a light coupling-out surface, wherein the light coupling-out surface of the conversion element is smaller than the radiation exit surface of the semiconductor chip.

5 Claims, 5 Drawing Sheets

(56) References Cited

U.S. PATENT DOCUMENTS

| | | | |
|---|---|---|---|
| 2017/0194538 A1* | 7/2017 | Chen | H01L 33/56 |
| 2018/0029523 A1* | 2/2018 | Shichijo | H01L 33/60 |
| 2018/0130776 A1* | 5/2018 | Oka | H01L 33/508 |
| 2018/0212118 A1* | 7/2018 | Chen | H01L 33/56 |
| 2018/0212128 A1* | 7/2018 | Hayashi | H01L 33/507 |
| 2018/0226552 A1* | 8/2018 | Lee | H01L 33/56 |
| 2018/0277721 A1* | 9/2018 | Bando | H01L 33/60 |
| 2019/0019783 A1* | 1/2019 | Tangring | H01L 33/54 |

FOREIGN PATENT DOCUMENTS

| | | |
|---|---|---|
| DE | 102017 104 144 A1 | 8/2018 |
| DE | 10 2017 104 479 A1 | 9/2018 |
| DE | 10 2017 107 226 A1 | 10/2018 |
| DE | 10 2017 107 234 A1 | 10/2018 |
| WO | 2015/071109 A1 | 5/2015 |

* cited by examiner

OPTOELECTRONIC DEVICE, CONVERSION ELEMENT, METHOD OF PRODUCING A PLURALITY OF CONVERSION ELEMENTS AND METHOD OF PRODUCING AN OPTOELECTRONIC DEVICE

TECHNICAL FIELD

This disclosure relates to an optoelectronic device, a conversion element, a method of producing a plurality of conversion elements and a method of producing an optoelectronic device.

Optoelectronic devices and conversion elements are described, for example, in DE 10 2017 107 234 A1, DE 10 2017 107 226 A1, DE 10 2017 104 479 A1, DE 10 2017 104 144 A1, US 2016/0293810 A1 and DE 10 2013 112 549 A1.

SUMMARY

We provide an optoelectronic device including a radiation emitting semiconductor chip emitting electromagnetic radiation of a first wavelength range from a radiation exit surface, and a conversion element converting electromagnetic radiation of the first wavelength range into electromagnetic radiation of a second wavelength range at least partially and emitting electromagnetic radiation from a light coupling-out surface, wherein the light coupling-out surface of the conversion element is smaller than the radiation exit surface of the semiconductor chip.

We also provide a conversion element converting electromagnetic radiation of a first wavelength range into electromagnetic radiation of a second wavelength range including a conversion plate having side surfaces perpendicular to a main extension plane of the conversion plate, wherein a transparent element is adjacent to the side surface, and the transparent element is formed to guide electromagnetic radiation to a light coupling-out surface of the conversion plate.

We further provide a method of producing a plurality of conversion elements including applying a plurality of conversion plates to an auxiliary carrier, applying transparent elements between the conversion plates, and separating the composite of conversion plates and transparent elements along separation lines extending within the transparent elements such that a plurality of conversion elements are generated.

We still further provide a method of producing an optoelectronic device including providing a radiation emitting semiconductor chip having a radiation exit surface from which electromagnetic radiation of a first wavelength range is emitted during operation of the semiconductor chip, and applying a conversion element to the radiation exit surface of the semiconductor chip, wherein a light coupling-in surface of the conversion element faces to the radiation exit surface, and the light coupling-out surface of the conversion element is smaller than the radiation exit surface of the semiconductor chip.

REFERENCE SIGNS

1 Conversion plate
2 auxiliary carrier
3 resin
4 transparent element/fillet/dam
5 separation line
6 conversion element
7 light coupling-in surface
8 light coupling-out surface
9 side surface
10 semiconductor chip
11 radiation exit surface
12 electrical contacts
13 electrical connection points
14 connection carrier
15 potting

DETAILED DESCRIPTION

We provide an optoelectronic device, the light exit surface of which has a defined shape and size and the light flux of which is particularly high, a conversion element for such an optoelectronic device and method of producing the conversion element and the optoelectronic device.

The optoelectronic device comprises a radiation-emitting semiconductor chip. The radiation-emitting semiconductor chip emits electromagnetic radiation of a first wavelength range from a radiation exit surface. The semiconductor chip is preferably a light emitting diode chip.

For example, the semiconductor chip can be a flip chip. A flip chip typically has a carrier with a first main surface, on which a semiconductor layer sequence with a radiation-generating active zone is grown epitaxially. Typically, the carrier is transparent at least for the electromagnetic radiation generated in the active zone. For example, the carrier has one of the following materials or is formed of one of the following materials: sapphire, silicon carbide. The carrier has a second main surface opposite the first main surface. The second main surface of the carrier is referred to as the radiation exit surface of the semiconductor chip. Typically, however, the flip chip also emits electromagnetic radiation at least via the side surfaces of the carrier. Typically, two electrical contacts are arranged on the rear side of the flip chip that are intended to electrically contact the semiconductor chip. The front side of the flip chip is typically free of electrical contacts.

The optoelectronic device may comprise a conversion element. The conversion element is suitable for converting electromagnetic radiation of the first wavelength range into electromagnetic radiation of a second wavelength range at least partially. The first wavelength range is particularly preferably different from the second wavelength range. For example, the first wavelength range has blue light or is formed from blue light. The second wavelength range has, for example, red or green light or is formed from one of these wavelength ranges. The conversion element particularly preferably emits the converted electromagnetic radiation of the second wavelength range from a light coupling-out surface. If the conversion element converts the electromagnetic radiation of the first wavelength range into electromagnetic radiation of the second wavelength range only partially, the conversion element emits electromagnetic radiation of the first wavelength range as well as electromagnetic radiation of the second wavelength range from the light coupling-out surface.

Particularly preferably, the light coupling-out surface of the conversion element is smaller than the radiation exit surface of the semiconductor chip. For example, the light coupling-out surface of the conversion element is smaller than the radiation exit surface of the semiconductor chip because the size and the shape of the light coupling-out surface of the conversion element are determined by an external optical system.

Particularly preferably, the light coupling-out surface of the conversion element and the radiation exit surface of the semiconductor chip extend parallel to one another.

For example, the light coupling-out surface of the conversion element has a size of 1 mm² or an integer multiple of this value.

Preferably, the conversion element has a conversion plate or is formed from a conversion plate. If the conversion element is formed by a conversion plate, the light coupling-out surface of the conversion element is typically formed by the light coupling-out surface of the conversion plate and a light coupling-in surface of the conversion element is formed by a light coupling-in surface of the conversion plate.

The light exit surface of the optoelectronic device can be formed by the light coupling-out surface of the conversion element. The light exit surface has the same shape and surface as the light coupling-out surface of the conversion element.

The light coupling-in surface of the conversion element, the coupling-out surface of the conversion element and the radiation exit surface are preferably parallel to one another. For example, the conversion element with the light coupling-in surface is applied to the radiation exit surface of the semiconductor chip. For example, the light coupling-in surface is attached to the radiation exit surface of the semiconductor chip with an adhesion-promoting layer.

The conversion element may be formed from a conversion plate. The light coupling-in surface of the conversion plate is preferably smaller than or equal to the radiation exit surface of the semiconductor chip and preferably larger than the light coupling-out surface of the conversion plate. The conversion element is preferably positioned centrally on the radiation exit surface of the semiconductor chip. Furthermore, in this example, the conversion plate preferably has oblique side surfaces that connect the light coupling-out surface of the conversion plate and the light coupling-in surface of the conversion plate with one another. In other words, the side surfaces of the conversion plate preferably include an acute angle with a normal of a main extension plane of the conversion plate. For example, the cross-sectional area of the conversion plate tapers from the light coupling-in surface to the light coupling-out surface, preferably continuously. In this way, light entering the light coupling-in surface of the conversion plate from the semiconductor chip is guided to the light coupling-out surface and the light flow of the optoelectronic device is increased. In this example, it is particularly advantageous that the light coupling-in surface of the conversion plate essentially corresponds in shape and/or the size to the radiation exit surface. "Essentially the same" means that the size and/or the shape of the light coupling-in surface of the conversion plate does not deviate by more than 5% from the shape and/or the size of the radiation exit surface.

The conversion plate may have side surfaces essentially perpendicular to the main extension plane of the conversion plate. Essentially vertical means that the angle which the side surfaces enclose with the main extension plane only deviates from 90° due to production process. For example, the angle only deviates from 90° by a value of 1° to 5°. In this example, a transparent element preferably adjoins the side surfaces. In this context, transparent means in particular that at least 85% and preferably at least 95% of the electromagnetic radiation of the first and/or the second wavelength range transmits the transparent element.

The transparent element preferably guides electromagnetic radiation from the semiconductor chip that exits from the radiation exit surface to the light coupling-out surface of the conversion element and/or to the light exit surface of the optoelectronic device. Particularly preferably, the transparent element expands the light coupling-in surface of the conversion element, preferably to the size and/or shape of the radiation exit surface of the semiconductor chip. The shape and/or size of the light coupling-in surface of the conversion element and the radiation exit surface of the semiconductor chip are essentially the same. "Essentially the same" means that the size and/or the shape of the light coupling-in surface of the conversion plate does not deviate by more than 5% from the shape and/or the size of the radiation exit surface. The light flux of the optoelectronic device can also be increased advantageously in this way.

For example, the transparent element is a transparent fillet or a transparent dam. The transparent element is preferably in direct contact with the side surfaces of the conversion element. For example, the transparent element is made of a resin, such as a silicone.

The conversion plate may have a wavelength converting glass or wavelength converting ceramic or is made of one of these materials.

The term "wavelength-converting" refers in particular to the conversion of irradiated electromagnetic radiation of a certain wavelength range into electromagnetic radiation of another, preferably longer wavelength range. Typically, a wavelength-converting element absorbs electromagnetic radiation of an irradiated wavelength range, converts it into electromagnetic radiation of another wavelength range by electronic processes on atomic and/or molecular level and emits the converted electromagnetic radiation again. In particular, pure scattering or pure absorption is not understood as wavelength converting.

A wavelength-converting glass, for example, has a transparent glass matrix, in which fluorescent particles are incorporated. A wavelength converting ceramic can be sintered from a green body containing fluorescent particles. The fluorescent particles are preferably responsible for the wavelength converting properties.

For example, one of the following materials is suitable for the fluorescent particles: rare earth doped garnets, rare earth doped alkaline earth sulfides, rare earth doped thiogallates, rare earth doped aluminates, rare earth doped silicates, rare earth doped orthosilicates, chlorosilicates doped with rare earths, alkaline earth silicon nitrides doped with rare earths, oxynitrides doped with rare earths, aluminum oxynitrides doped with rare earths, silicon nitrides doped with rare earths, sialons doped with rare earths.

The ratio of the radiation exit surface of the semiconductor chip to the light coupling-out surface of the conversion element may be 5:1 to 1.005:1. Particularly preferably, the ratio of the radiation exit surface of the semiconductor chip to the light coupling-out surface of the conversion element is 2:1 to 1.1:1.

The semiconductor chip and the conversion element may be laterally covered by an absorbing potting. For example, the absorbing potting has a resin such as a silicone or an epoxy, in which soot particles are incorporated. The absorbing potting is particularly preferably formed to absorb electromagnetic radiation of the first wavelength range and/or the second wavelength range. Absorbing means that at most 10%°, preferably at most 5%°, of electromagnetic radiation of the specified wavelength range is transmitted. For example, the absorbing potting is formed black. The absorbing potting preferably covers the semiconductor chip and the conversion element such that electromagnetic radiation only exits from the radiation coupling-out surface of the conversion element from the optoelectronic device. The absorbing potting terminates particularly preferably flush with the radiation coupling-out surface of the conversion element.

A conversion element is described below. The conversion element is particularly suitable for use in the optoelectronic device. Features and examples described here only in connection with the optoelectronic device can therefore also be formed in the conversion element and vice versa.

The conversion element may convert electromagnetic radiation of a first wavelength range into electromagnetic radiation of a second wavelength range. The conversion element preferably has a light coupling-in surface and a light coupling-out surface. The light coupling-in surface and the light coupling-out surface of the conversion element are preferably arranged parallel to one another.

The conversion element may have a conversion plate. In this example, the side surface of the conversion plate is preferably perpendicular to a main extension plane of the conversion plate. The side surface preferably adjoins a transparent element formed to guide electromagnetic radiation to the radiation coupling-out surface of the conversion element.

For example, the conversion element can be produced using the method described below. Examples and features described only in connection with the conversion element may also be formed in the method and vice versa.

According to an example of the method of producing a plurality of conversion elements, a plurality of conversion plates are applied to an auxiliary carrier. The auxiliary carrier can, for example, be a carrier foil.

Transparent elements may be applied between the conversion layers.

The composite of conversion plates and transparent elements may be separated along separation lines extending within the transparent elements such that a plurality of conversion elements are generated.

For example, the transparent elements are transparent fillets. These can be produced, for example, by applying a transparent liquid resin between the conversion plates, for example, by dispensing or jetting. The surface of the resin forms a curvature whose center of curvature lies outside the transparent resin. The center of curvature is the center point of the curvature circle of the curvature. The curvature circle at a specific point of a curvature is the circle that best approximates the curvature at this point. In this example, the curvature of the liquid resin is formed preferably by the surface tension of the resin. The separation lines preferably extend through the lowest point of the curvature.

The transparent liquid resin may be cured before the separation.

The transparent element may be formed by Foil Assistant Molding on the side surfaces of the conversion element.

A conversion plate, for example, with oblique side surfaces formed from a wavelength-converting ceramic can be produced, for example, by forming a green body from a precursor material of the ceramic. The green body can be shaped to the desired shape by a punching and/or embossing process. The ceramic is produced by sintering the green body. Furthermore, it is also possible to shape a wavelength-converting ceramic conversion plate or green body into the desired shape by punching, sawing, sandblasting, laser cutting or embossing.

A conversion plate, for example, with oblique side surfaces formed from a wavelength-converting glass can be achieved by hot stamping or die casting, for example.

A method of producing an optoelectronic device is described below. Features and examples only described in connection with the optoelectronic device may also be formed in the method and vice versa.

A radiation emitting semiconductor chip may have a radiation exit surface from which electromagnetic radiation of a first wavelength range is emitted during operation of the semiconductor chip.

A conversion element may be applied to the radiation exit surface of the semiconductor chip. Preferably, a light coupling-in surface of the conversion element faces the radiation exit surface of the semiconductor chip. Furthermore, the radiation coupling-out surface of the conversion element is particularly preferably smaller than the radiation exit surface of the semiconductor chip.

The conversion element may have a conversion plate with at least one side surface perpendicular to a main extension plane of the conversion plate. In this example of method, a transparent dam is preferably applied to the exposed surfaces of the radiation exit surface. The transparent dam is particularly preferably adjacent to the at least one side surface of the conversion plate. Particularly preferably, the transparent dam is arranged completely circumferentially around the conversion plate. For example, the dam is formed to be lower than the conversion plate.

Furthermore, it is also possible for the conversion plate to be applied to the radiation exit surface of the semiconductor chip with such a large amount of transparent resin such as silicone that transparent fillets of the transparent resin are formed on the side surfaces of the semiconductor chip, when the semiconductor chip is pressed on. Particularly preferably, it is possible for the conversion plate to be applied to the radiation exit surface of the semiconductor chip with such a large amount of transparent resin such as silicone that transparent fillets of the transparent resin are formed on the side surfaces of the conversion element when the semiconductor chip is pressed on. For this example of the method, a conversion plate with at least one lateral surface perpendicular to the main extension plane of the conversion plate is particularly preferred.

The semiconductor chip and the conversion element may be laterally covered with an absorbing potting.

The optoelectronic device is particularly suitable for use together with a secondary optic that predetermines the size and shape of the optoelectronic device and in particular the size and shape of the light exit surface thereof. Such devices can be used, for example, in headlamps or projectors. If the size and shape of the light exit surface of the optoelectronic device is predetermined, the light flux of the optoelectronic device cannot be increased by using a semiconductor chip with a larger radiation exit surface alone. In this example, the radiation exit surface of the semiconductor chip may be selected to be larger than the light coupling-out surface of the conversion element and/or the light exit surface of the optoelectronic device, and the conversion element is provided with oblique side surfaces such that light entering the conversion element from the radiation exit surface of the semiconductor chip is guided to the light coupling-out surface of the conversion element. Alternatively, transparent elements are provided on the side surfaces of the conversion plate that likewise take over this task. In this way, the light flux of the optoelectronic device can be increased while the light exit surface of the optoelectronic device remains the same.

Further advantages and developments result from the examples described in the following in connection with the Figures.

Same, similar or similar acting elements are provided in the Figures with the same reference signs. The Figures and the proportions of the elements depicted in the Figures are not to be regarded as true to scale. Rather, individual elements, in particular layer thicknesses, may be exaggeratedly large for better representability and/or better understanding.

Figure 1:
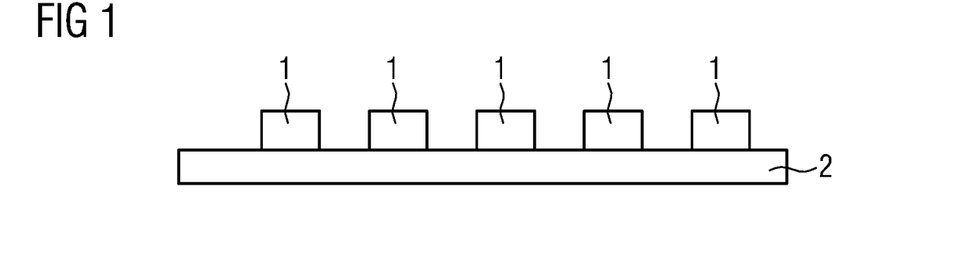
FIGS. 1 to 3 are schematic sectional views showing different stages of a method of producing of a plurality of conversion elements.
Figure 2:
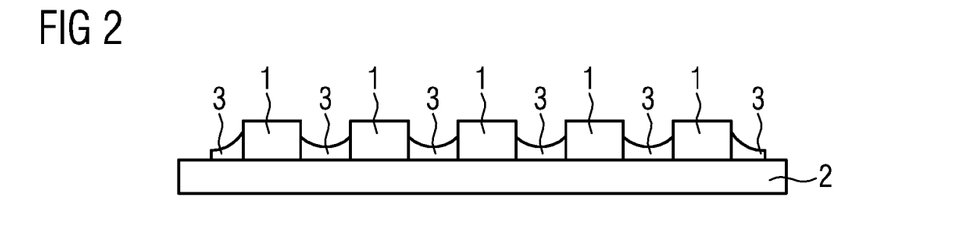
Figure 3:
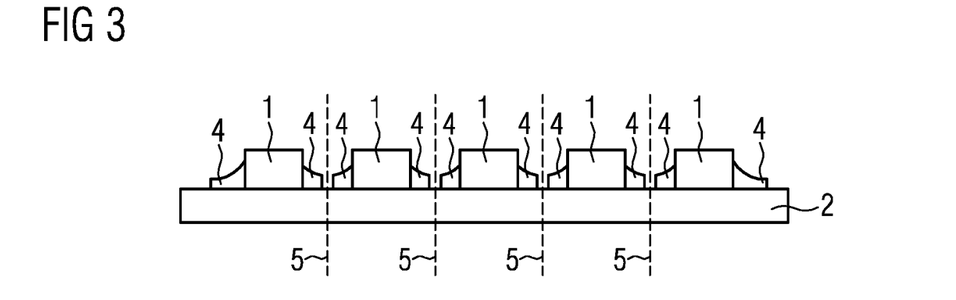

In the method according to the example of FIGS. 1 to 3, first, a plurality of conversion plates 1 are provided on an auxiliary carrier 2, for example, a foil. The conversion plates 1 are applied spaced apart from one another on the auxiliary carrier 2 as shown in FIG. 1. The conversion plates 1 are suitable for converting electromagnetic radiation of a first wavelength range into electromagnetic radiation of a second wavelength range. For example, the conversion plates 1 are made of a wavelength converting glass or a wavelength converting ceramic.

In a next step, shown schematically in FIG. 2, a liquid resin 3 is introduced into the surfaces between two directly adjacent conversion plates 1, for example, by jetting or dispensing. The liquid resin 3 is directly adjacent to the side surfaces of the conversion plates 1. Due to the surface tension of the liquid resin 3 a curved surface of the resin 3 is formed. The curvature of the surface of the resin 3 has a center of curvature outside the transparent resin 3. The resin 3 is preferably transparent at least for the electromagnetic radiation of the first and/or the second wavelength range. For example, silicone is used as resin 3. In a next step, the resin 3 is cured so that transparent elements 4 are formed on the side surfaces of the conversion plates 1.

Finally, the composite of conversion plates 1 and transparent elements 4 is separated along separation lines 5 extending within the transparent elements 4 such that a plurality of conversion elements 6 are generated. The conversion elements 6 are arranged on the auxiliary carrier 2.

Figure 4:
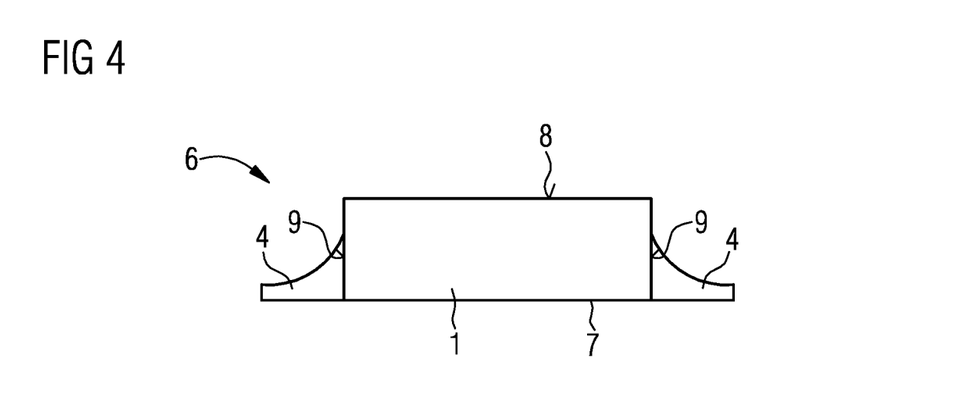
FIG. 4 is a schematic sectional view showing a conversion element according to an example.

The conversion element 6 according to the example of FIG. 4 can be produced, for example, by using the method according to the example of FIGS. 1 to 3.

The conversion element 6 according to the example in FIG. 4 has a conversion plate 1 with a light coupling-in surface 7 and a light coupling-out surface 8 extending parallel to one another. The light coupling-in surface 7 and the light coupling-out surface 8 connect by at least one side surface 9 arranged perpendicularly on a main extension plane of the conversion plate 1. A transparent fillet 4 made of a transparent resin 3 is arranged circumferentially around the sides of the conversion plate 1. The transparent fillet 4 increases the light coupling-in surface 7 of the conversion element 6 compared to the light coupling-out surface 8. In addition, the transparent fillet 4 guides electromagnetic radiation to the light coupling-out surface 8 of the conversion element 6.

Figure 5:
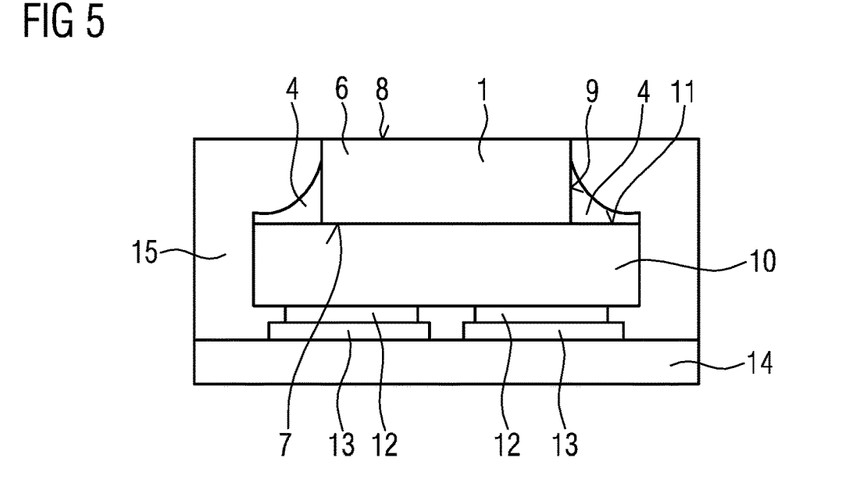
FIG. 5 is a schematic sectional view showing an optoelectronic device according to an example.

The optoelectronic device according to the example of FIG. 5 has a radiation-emitting semiconductor chip 10 generating electromagnetic radiation of a first wavelength range in an active zone and emits it from a radiation exit surface 11. The semiconductor chip 10 is electrically conductively applied to electrical connection points 13 of a connection carrier 14 via two electrical contacts 12 opposite the radiation exit surface 11.

A conversion element 6 is arranged on the radiation exit surface 11 of the semiconductor chip 10 as already described in FIG. 3. The transparent fillet 4 on the side surfaces 9 of the conversion plate 1 terminates flush with the side surfaces of the semiconductor chip 10.

The light coupling-out surface 8 of the conversion element 6 is smaller than the radiation exit surface 11 of the semiconductor chip 10. But, the light coupling-in surface 7 of the conversion element 6 is enlarged by the transparent fillet 4 such that the shape and the size of the light coupling-in surface 7 of the conversion element 6 substantially match the shape and the size of the radiation exit surface 11 of the semiconductor chip 10.

Laterally, the semiconductor chip 10 and the conversion element 6 are completely covered with an absorbing potting 15, which is formed black. The black potting 15 directly adjoins the conversion element 6 and the semiconductor chip 10 and the black potting 15 terminates flush with the light coupling-out surface 8 of the conversion element 6. In this example, the light exit surface of the optoelectronic device is formed by the light coupling-out surface 8 of the conversion element 6. In particular, the absorbing potting 15 prevents electromagnetic radiation from emitting from the side surfaces of the semiconductor chip 10.

Figure 6:
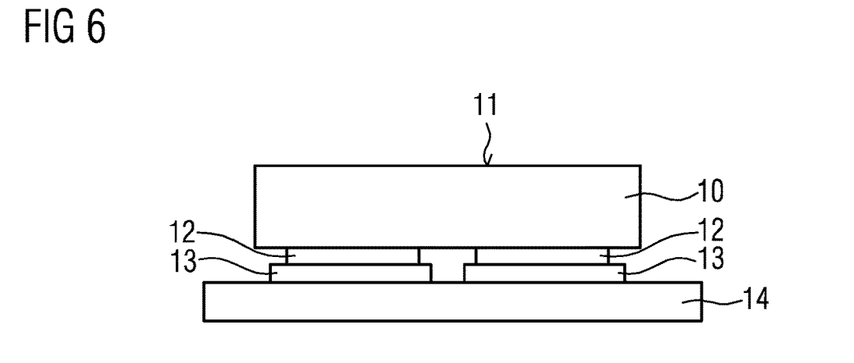
FIGS. 6 to 8 are schematic sectional views showing different stages of a method of producing an optoelectronic device.
Figure 7:
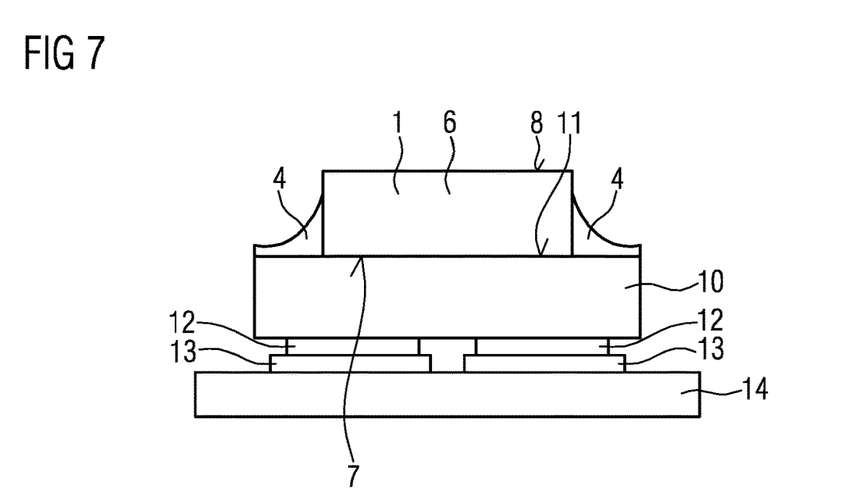
Figure 8:
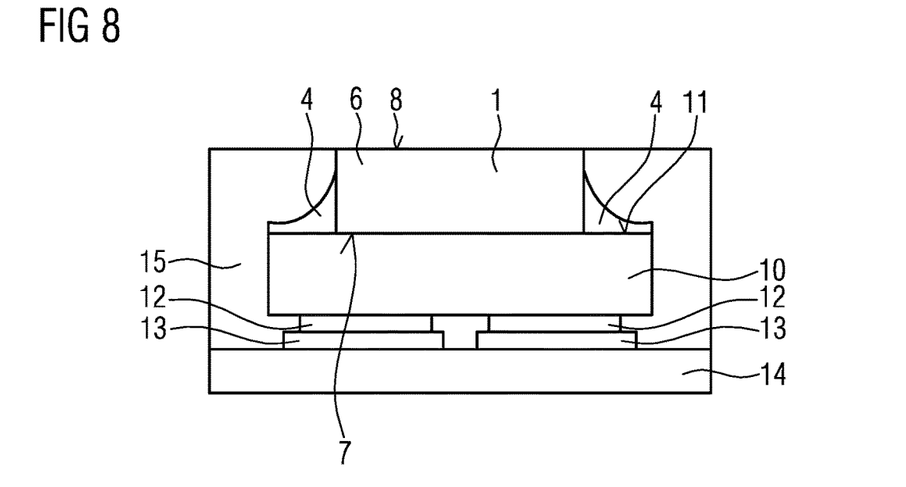

In the method according to the example of FIGS. 6 to 8, initially, a radiation-emitting semiconductor chip 10 is provided as shown in FIG. 6. The radiation-emitting semiconductor chip 10 connects to connection points 13 of a connection carrier 14 in an electrically conductive and mechanically stable manner via two electrical contacts 12 opposite the radiation exit surface 11.

In a next step schematically shown in FIG. 7, a conversion plate 1 is applied to the semiconductor chip 10. A conversion plate 1 is used whose side surfaces are perpendicular to a main extension plane of the conversion plate 1. Then, a liquid resin 3 is applied to the radiation exit surface 11 of the semiconductor chip 10 and the conversion plate 1 is placed on the liquid resin 3. Finally, the conversion plate 1 is pressed onto the liquid resin 3 such that the liquid, transparent resin 3 forms transparent fillets 4 around the side surfaces 9 of the conversion plate 1. Then, the transparent resin 3 is cured.

In a next step, the conversion element 6 and the semiconductor chip 10 are laterally encapsulated with a black potting 15 as shown in FIG. 8.

Figure 9:
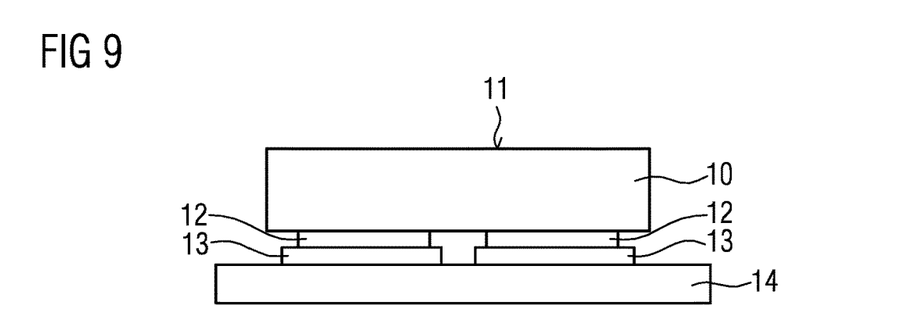
FIGS. 9 to 12 are schematic sectional views showing different stages of a method of producing an optoelectronic device.

In the method according to the example of FIGS. 9 to 12, a radiation-emitting semiconductor chip is again provided on a connection carrier, as already described in FIG. 6 and as shown in FIG. 9.

Figure 10:
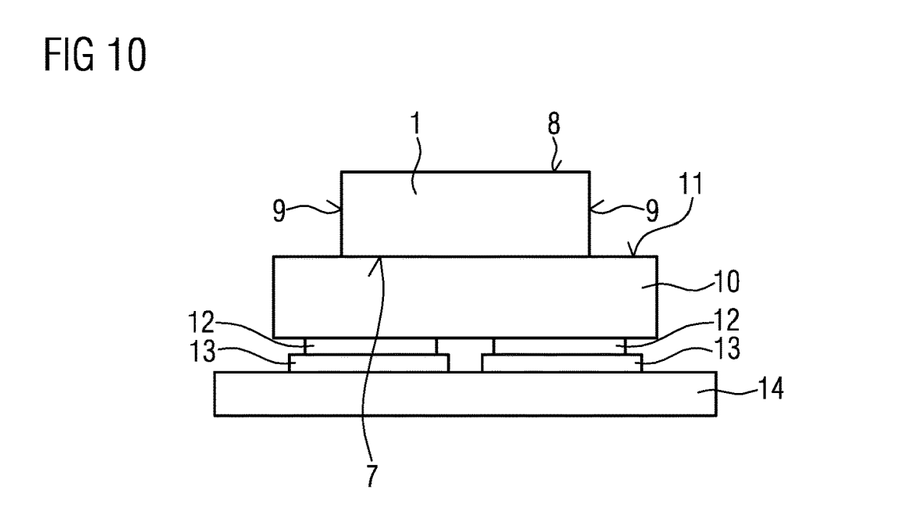

In a next step, a conversion element 6 is arranged on a radiation exit surface 11 of the radiation-emitting semiconductor chip 10 on the radiation exit surface 11 of the semiconductor chip 10. The conversion element 6 has a conversion plate 1. For example, the conversion plate 1 is made of a wavelength-converting ceramic or a wavelength-converting glass, or has one of these materials.

The conversion plate 1 has a light coupling-in surface 7 smaller than the radiation exit surface 11 of the semiconductor chip 10 as shown in FIG. 10. Side surfaces 9 of the conversion plate 1 are perpendicular to a main extension plane of the conversion plate 1.

Figure 11:
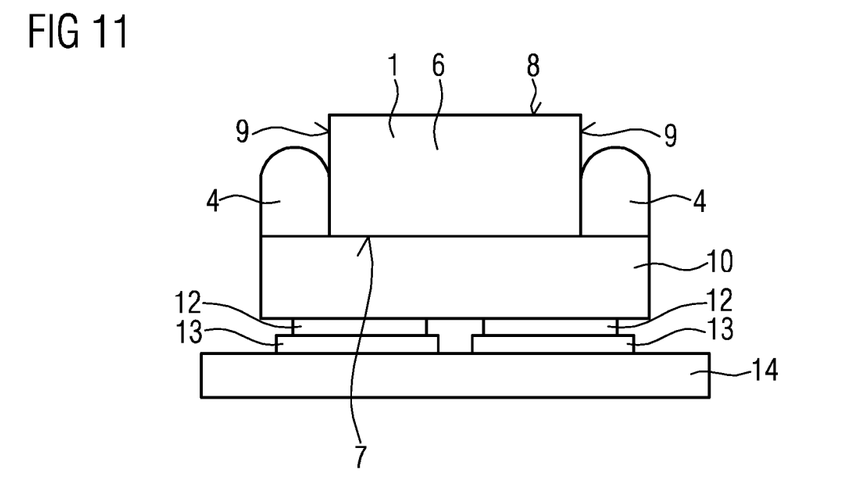

In a next step, a transparent dam 4 is arranged on the side surfaces 9 of the conversion plate 1, for example, by dispensing as shown in FIG. 11. In this example, the transparent dam 4 is lower than the conversion plate 1. Particularly preferably, the transparent dam 4 extends completely around the conversion plate 1. Furthermore, the transparent dam 4 extends the light coupling-in surface 7 of the conversion element 6 such that the light coupling-in surface 7 essentially has the shape and the size of the radiation exit surface 11 of the semiconductor chip 10. The transparent dam 4 guides light that exits from the radiation exit surface 11 to the light coupling-out surface 8 of the conversion element 6.

Figure 12:
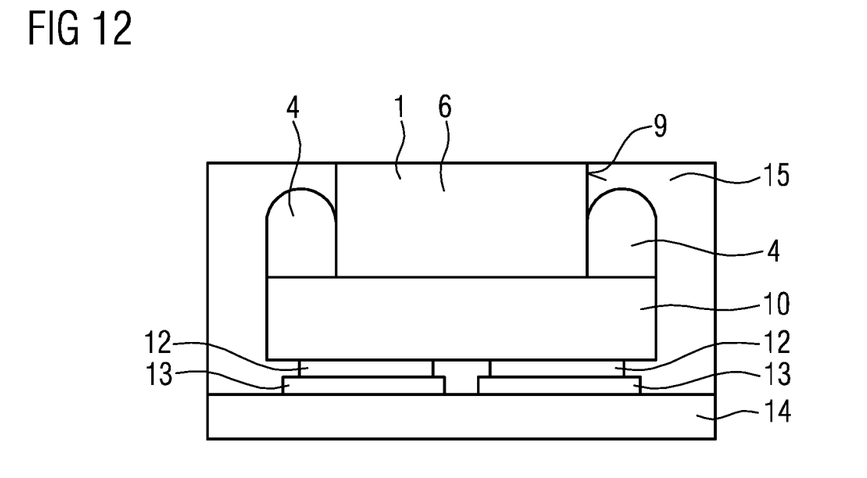

In a next step, the conversion element 6 and the semiconductor chip 10 are encapsulated with a black potting 15. In this example, the black potting 15 terminates flush with the light coupling-out surface 8 of the conversion element 6 as shown in FIG. 12.

Figure 13:
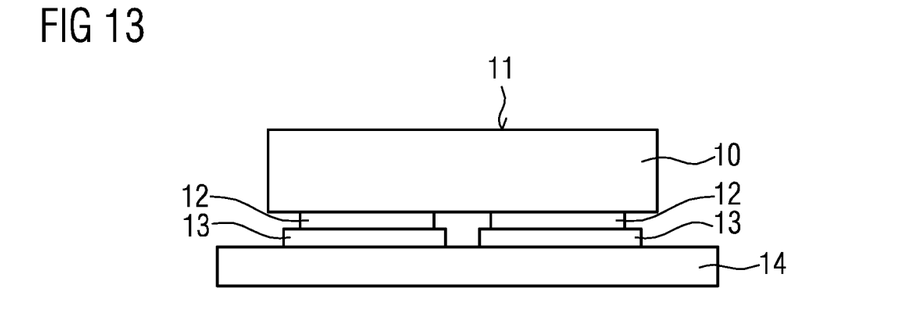
FIGS. 13 to 15 are schematic sectional views showing different stages of a method of producing an optoelectronic device.
Figure 14:
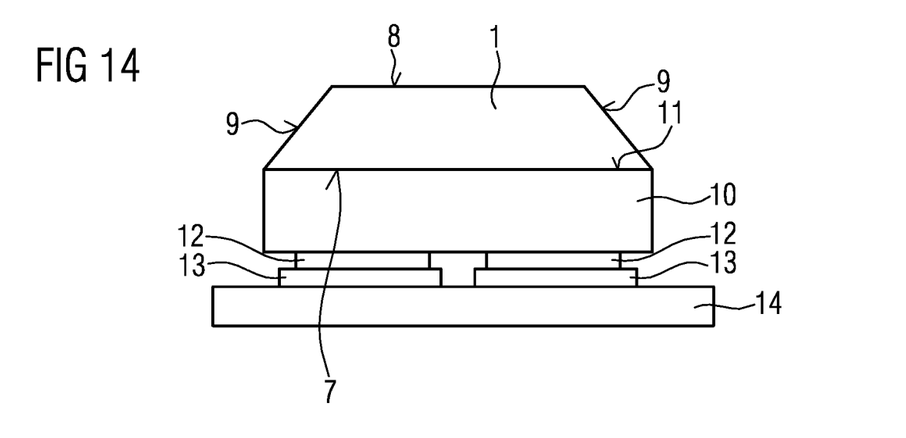
Figure 15:
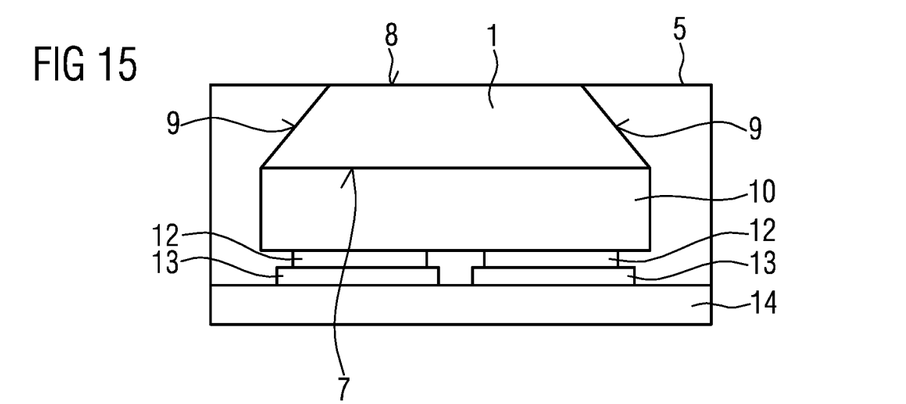

In the method according to the example of FIGS. 13 to 15, a radiation-emitting semiconductor chip 10 is again provided on a connection carrier 14, as already described in FIG. 6 and as shown in FIG. 13.

In a next step, a conversion element 6 is arranged on a radiation exit surface 11 of the radiation-emitting semiconductor chip 10. In this example, the conversion element 6 is formed by a conversion plate 1. For example, the conversion plate 1 is made of a wavelength-converting ceramic or a wavelength-converting glass, or has one of these materials.

In this example, the conversion plate 1 has a light coupling-in surface 7 larger than the light coupling-out surface 8. In addition, the conversion plate 1 has oblique side surfaces 9, which preferably has an acute angle with a normal of the main extension plane of the conversion plate 1. A cross-sectional surface of the conversion plate 1 tapers from the light coupling-in surface 7 to the light coupling-out surface 8, preferably continuously.

In a next step, the conversion element 6 and the semiconductor chip 10 are laterally encapsulated with a black potting 15. In this example, the black potting 15 terminates flush with the light coupling-out surface 8 of the conversion element 6 as shown in FIG. 15.

This application claims priority of DE 102018110506.1, the subject matter of which is incorporated herein by reference in its entirety.

Our devices, elements and methods are not limited to the examples by the description on the basis of the examples. Rather, this disclosure includes any new feature and any combination of features that in particular includes each combination of features in the appended claims, even if the feature or combination itself is not explicitly mentioned in the claims or examples.

What is claimed is:

1. A method of producing an optoelectronic device comprising:
    providing a radiation emitting semiconductor chip having a radiation exit surface from which electromagnetic radiation of a first wavelength range is emitted during operation of the semiconductor chip,
    applying a conversion element to the radiation exit surface of the semiconductor chip, and
    applying transparent elements to at least a portion of the radiation exit surface,
    wherein a light coupling-in surface of the conversion element faces to the radiation exit surface,
    the light coupling-out surface of the conversion element is smaller than the radiation exit surface of the semiconductor chip,
    wherein the transparent element has a cross section with a rounded end region followed by a rectangular dam region, said rectangular dam region faces a light entrance surface of the conversion plate and said rounded end region faces the radiation exit surface of the conversion plate.

2. The method according to claim 1, wherein
    the conversion element has a conversion plate with at least one side surface perpendicular to a main extension plane of the conversion plate, and
    a transparent dam is applied to the exposed regions of the radiation exit surface, and the transparent dam adjacent to the side surface of the conversion plate.

3. The method according to claim 1, wherein
    the conversion element has a conversion plate with at least one side face perpendicular to a main extension plane of the conversion plate is provided, and
    the conversion plate is applied to the radiation exit surface of the semiconductor chip with an amount of transparent resin such that transparent fillets of the transparent resin are formed on the side surfaces of the conversion plate, when the semiconductor chip is pressed on.

4. The method according to claim 1, wherein the semiconductor chip and the conversion element are laterally covered with an absorbing potting.

5. The method according to claim 1, wherein the transparent element is made of a resin.

* * * * *